(12) United States Patent
Isely et al.

(10) Patent No.: US 10,530,862 B2
(45) Date of Patent: Jan. 7, 2020

(54) DETERMINING SLICES TO REBUILD FROM LOW-LEVEL FAILURES

(71) Applicant: International Business Machines Corporation, Armonk, NY (US)

(72) Inventors: Michael Christian Isely, Batavia, IL (US); Jason K. Resch, Chicago, IL (US)

(73) Assignee: PURE STORAGE, INC., Mountain View, CA (US)

(*) Notice: Subject to any disclaimer, the term of this patent is extended or adjusted under 35 U.S.C. 154(b) by 100 days.

(21) Appl. No.: 15/848,196

(22) Filed: Dec. 20, 2017

(65) Prior Publication Data

US 2018/0115606 A1 Apr. 26, 2018

Related U.S. Application Data

(63) Continuation-in-part of application No. 15/812,706, filed on Nov. 14, 2017, now Pat. No. 10,362,111, which is a continuation of application No. 14/956,818, filed on Dec. 2, 2015, now Pat. No. 9,826,038.

(60) Provisional application No. 62/109,712, filed on Jan. 30, 2015.

(51) Int. Cl.
*H03M 13/15* (2006.01)
*H04L 29/08* (2006.01)
*H03M 13/37* (2006.01)
*H03M 13/09* (2006.01)

(52) U.S. Cl.
CPC ......... *H04L 67/1097* (2013.01); *H03M 13/09* (2013.01); *H03M 13/1515* (2013.01); *H03M 13/3761* (2013.01)

(58) Field of Classification Search
CPC ...................................................... H03M 13/15
USPC ........................................ 714/759, 762, 760
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |

(Continued)

OTHER PUBLICATIONS

Chung; An Automatic Data Segmentation Method for 3D Measured Data Points; National Taiwan University; pp. 1-8; 1998.

(Continued)

*Primary Examiner* — Fritz Alphonse
(74) *Attorney, Agent, or Firm* — Garlick & Markison; Edward J. Marshall

(57) ABSTRACT

A distributed storage network (DSN) includes multiple distributed storage task execution (DST EX) units, each employing multiple memory portions to store encoded data slices. A DST EX unit detects a physical storage failure associated with an affected memory portion of a storage unit included in the DST EX unit. A memory portion identifier of the affected memory portion is used to identify a range of impacted encoded data slices associated with the affected memory portion, and in some cases specific encoded data slices within that range. The DST Ex unit issues rebuilding information to the DSN. The rebuilding information includes at least one identifier associated with at least one impacted encoded data slice included in the range of impacted encoded data slices.

20 Claims, 6 Drawing Sheets

(56) References Cited

U.S. PATENT DOCUMENTS

| | | | |
|---|---|---|---|
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2015/0220396 | A1* | 8/2015 | Shirley, Jr. ............... G06F 3/06 714/6.23 |
| 2015/0227414 | A1 | 8/2015 | Varma |
| 2016/0117219 | A1 | 4/2016 | Halbert et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): String Representation of Distinguished Names; IETF Network Working Group; RFC 4514; Jun. 2006; pp. 1-15.

* cited by examiner

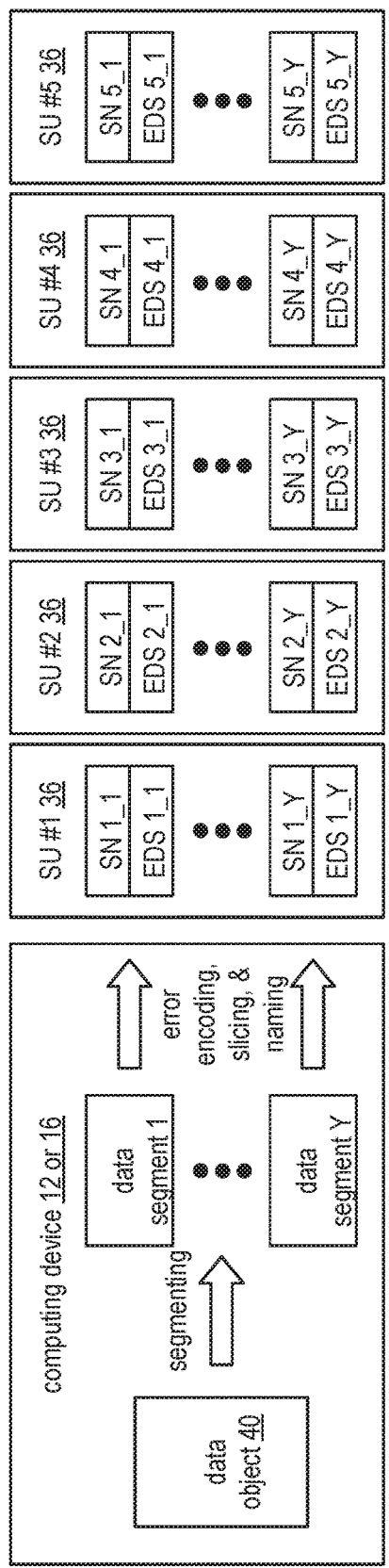
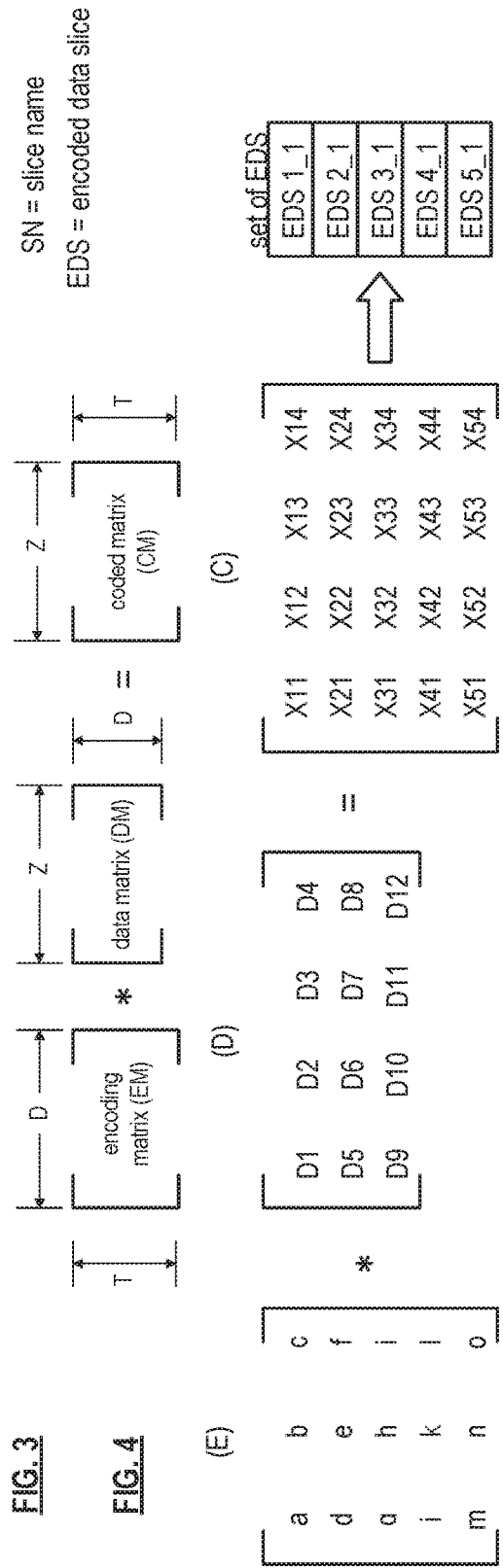
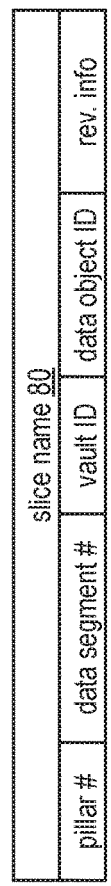
FIG. 3
FIG. 4
FIG. 5
FIG. 6

DETERMINING SLICES TO REBUILD FROM LOW-LEVEL FAILURES

CROSS-REFERENCE TO RELATED APPLICATIONS

The present U.S. Utility Patent Application claims priority pursuant to 35 U.S.C. § 120 as a continuation-in-part of U.S. Utility application Ser. No. 15/812,706 entitled "SELECTING A DATA STORAGE RESOURCE OF A DISPERSED STORAGE NETWORK" filed Nov. 14, 2017, which claims priority pursuant to 35 U.S.C. § 120 as a continuation of U.S. Utility application Ser. No. 14/956,818 entitled "SELECTING A DATA STORAGE RESOURCE OF A DISPERSED STORAGE NETWORK" filed Dec. 2, 2015, now U.S. Pat. No. 9,826,038 issued on Nov. 21, 2017, which claims priority pursuant to 35 U.S.C. § 119(e) to U.S. Provisional Application No. 62/109,712, entitled "UTILIZING ALTERNATE STORAGE RESOURCES WITHIN A DISPERSED STORAGE NETWORK," filed Jan. 30, 2015, all of which are hereby incorporated herein by reference in their entirety and made part of the present U.S. Utility Patent Application for all purposes.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

In some conventional storage systems, a memory device performs scans and health checks within itself to determine when data it stores is lost. For example, when an unrecoverable read error results in a lost block in a hard drive or solid state device (SSD), a report of which block number was lost may be made to the storage system, which generally marks the bad blocks so that the storage system does not attempt to use the bad blocks for future storage. But actually recovering the data stored in the lost block usually requires manually running a hard drive recovery tool, if the data contained in the block can be recovered at all. In some RAID systems, an entire faulty drive or device can be reconstructed from data on other drives.

BRIEF DESCRIPTION OF THE DRAWINGS

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION

Figure 1:
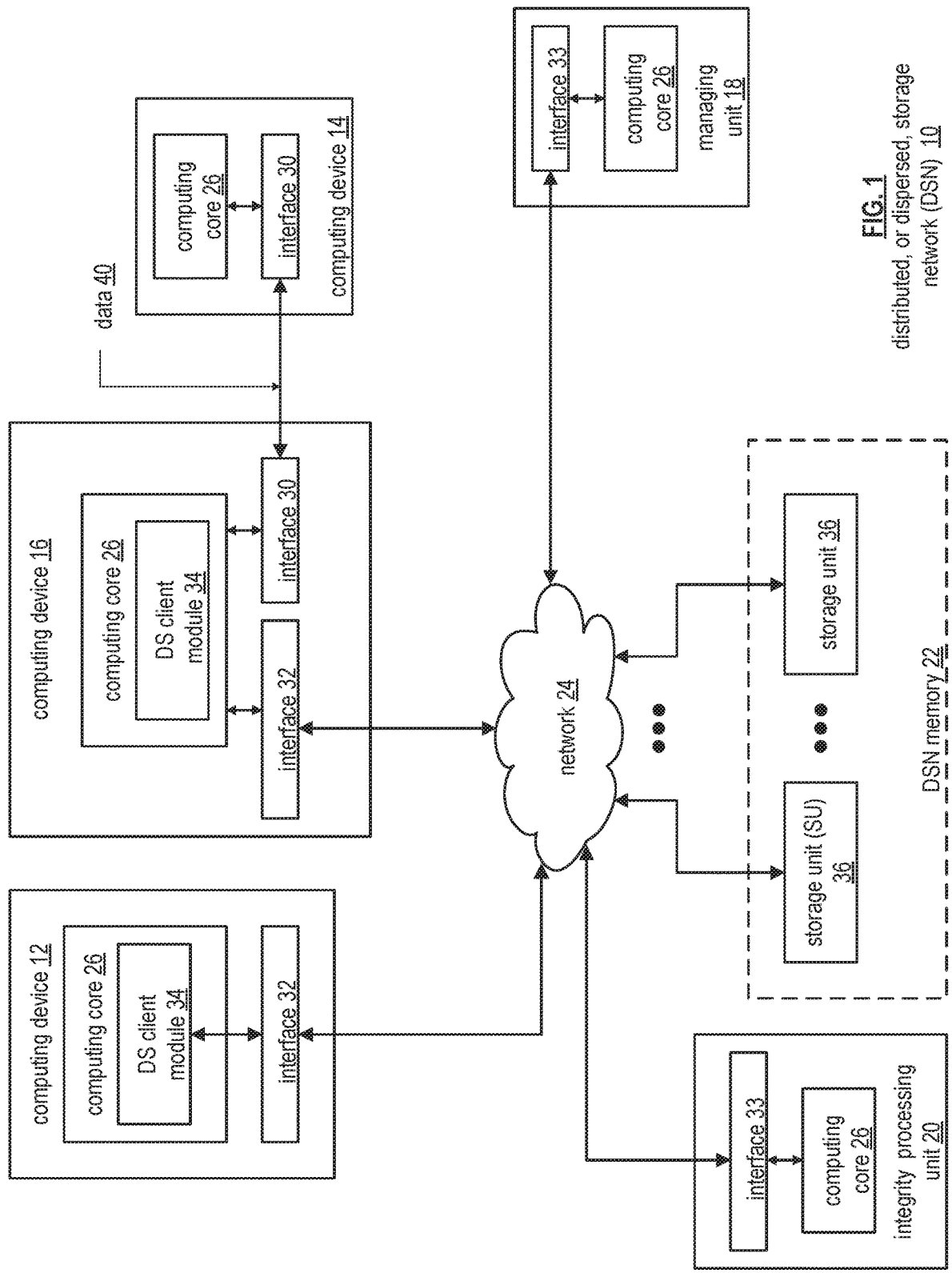
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units

Figure 2:
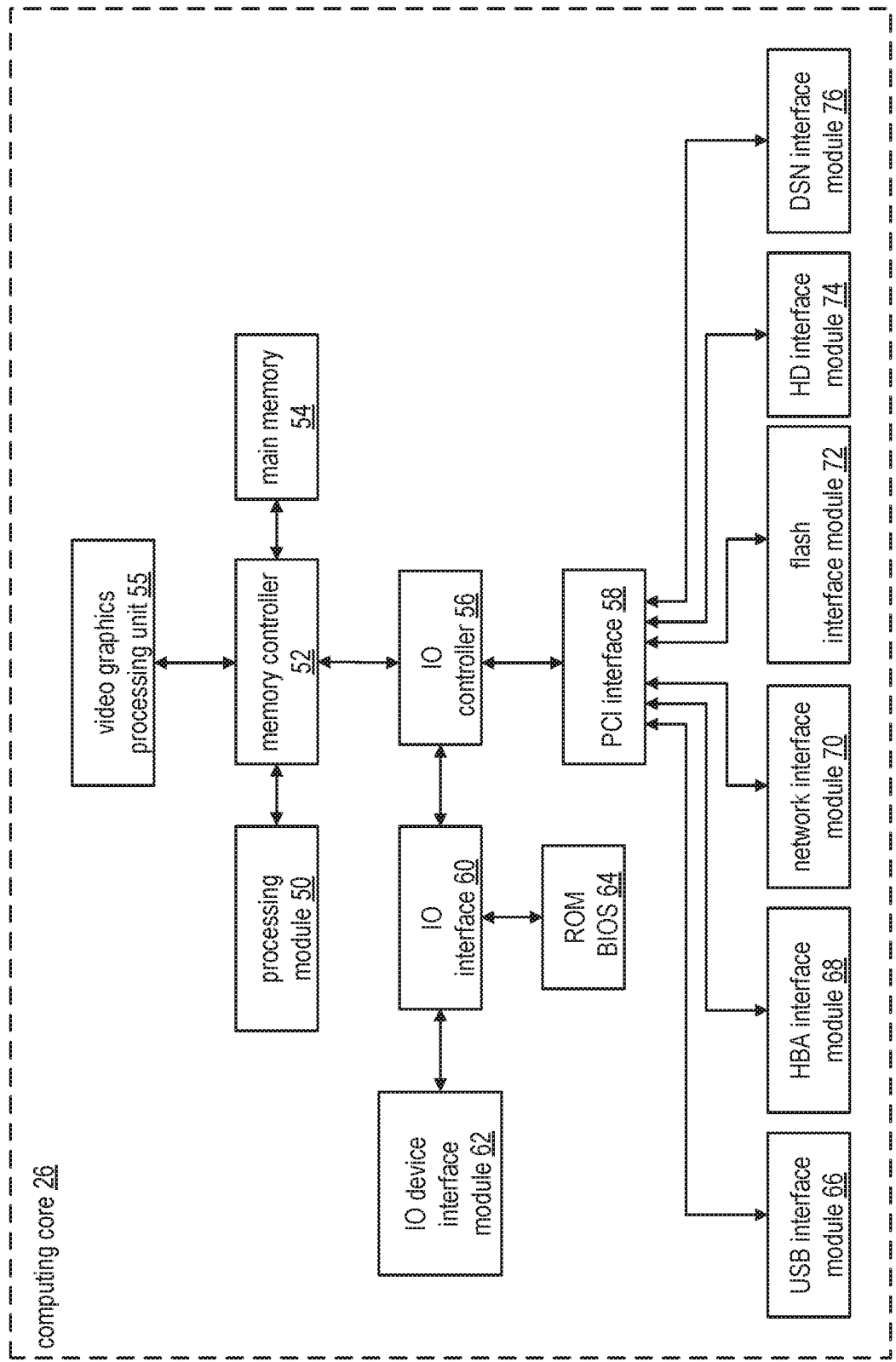
FIG. 2 is a schematic block diagram of an embodiment of a computing core in accordance with the present invention.

36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
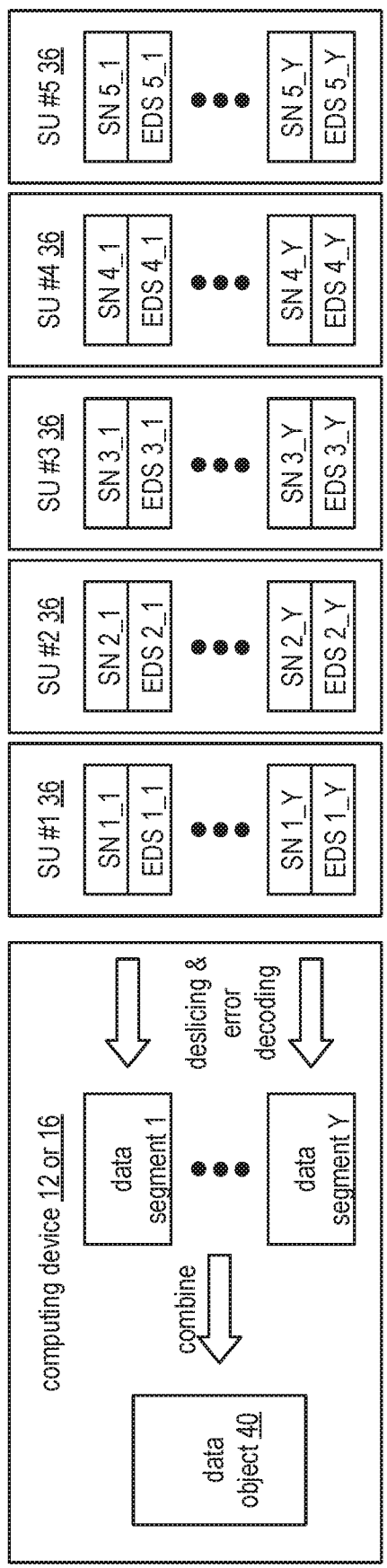
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
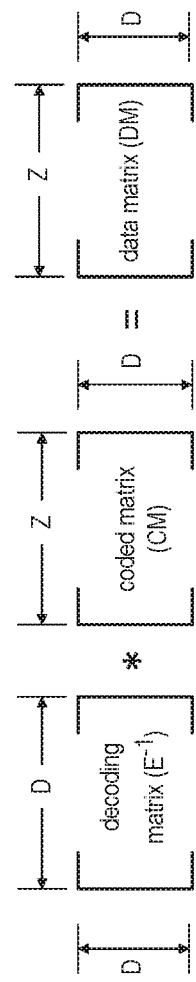
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
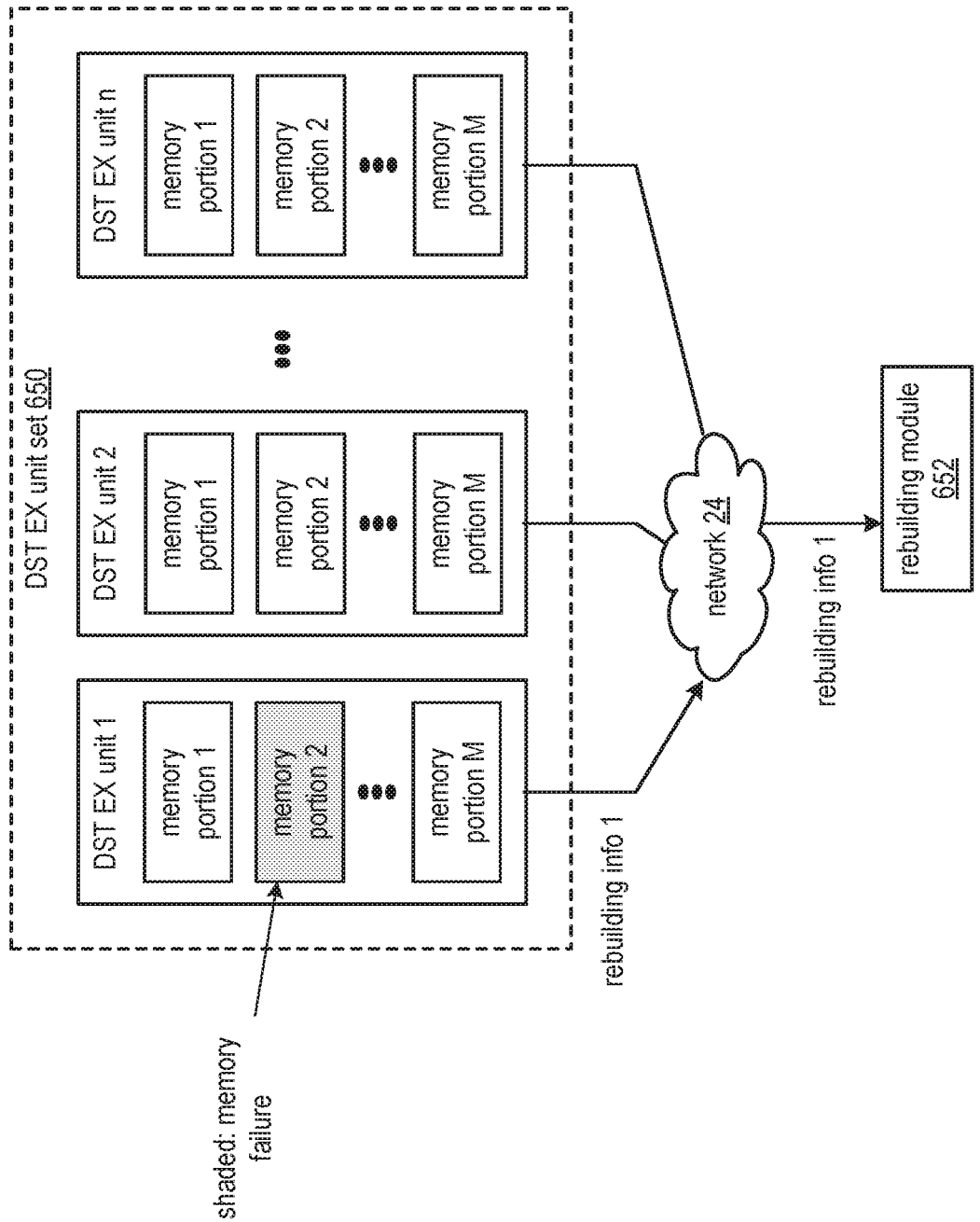
FIG. 9 is a schematic block diagram of an embodiment of a dispersed storage network (DSN) in accordance with the present invention.
Figure 10:
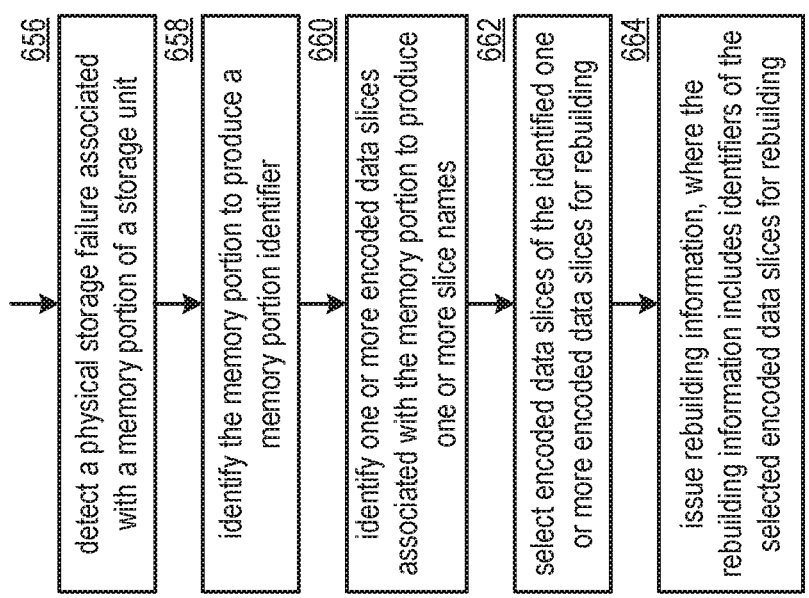
FIG. 10 is a flowchart illustrating an example of identifying an encoded data slice for rebuilding for accessing encoded data slices accordance with the present invention.

Referring next to FIGS. 9 and 10 various embodiments in which the identity of encoded slices to be rebuilt due to a low level memory failure are discussed. In various embodiments, an underlying memory device performs scans and health checks within itself to determine when data it stores is lost. For example, when an unrecoverable read error results in a lost block in a hard drive or SSD, a report of which block no was lost may be made to the system. Should such a data loss occur within a distributed storage (DS) unit, which uses memory devices for storing encoded data slices, the loss of the block implies that some or all of a slice has been lost or corrupted and requires rebuilding.

If a memory device sends a notification indicating that an internal failure has occurred, that notification can trigger a distributed storage (DS) unit to take a corrective action. In some embodiments, the DS unit will attempt to perform a reverse determination of the affected area of the memory device, e.g. block number, offset, track number, etc., and map the affected area to a set of slice names that utilize storage resources of the affected area. This may, but need not, require the DS unit to maintain a reverse-lookup map linking areas on memory devices to encoded slices stored in particular areas of the memory. In other embodiments, the DS unit can reverse-engineer the low-level disk blocks to file system blocks, and from file system blocks to files and positions within files, and from files and positions within files to encoded data slices.

If such a reverse determination cannot be made, then the DS unit may fall back to a targeted or semi-targeted integrity scan of the affected area of the memory device, e.g. by reading slices and comparing their re-computed integrity check values against stored integrity check values. Regardless of the specific technique used, the corrective action can generate a list of impacted slices. An integrity verification check can be performed, to verify which that the integrity of the slices included in the list remains compromised, and that the encoded data slices have actually been lost or corrupted. Part of the corrective action includes organizing rebuilding resources to be used to effect repairs to these particular slices.

In more severe loss scenarios, even the names of slices stored in the affected memory area may be lost. In some such situations, the corrective action includes determining the possible extent of damage—not to a list of slice names—but to a list of slice name ranges. Recovery of these ranges can, in many cases, requires scanning or otherwise consulting other peer DS units to see what slices they hold in the slice name ranges, and to rebuild slices whose names are missing from the other peer DS units.

FIG. 9 is a schematic block diagram of an embodiment of a dispersed storage network (DSN) that includes a distributed storage and task (DST) execution (EX) unit set 650, the network 24 of FIG. 1, and a rebuilding module 652. Each DST execution unit, which can be implemented using storage unit 36 of FIG. 1, includes a plurality of memory portions 1-M, where one or more memory portions are associated with a common memory device. A memory portion may include one or more of a memory sector, a memory block, a memory track, and a memory cell. Each memory device may be implemented utilizing any of various memory devices, such as a hard drive, a solid state drive, or another memory device suitable for dispersed storage of encoded data slices. The rebuilding module 652 may be implemented utilizing one or more of the computing devices 12, 14, or 16 of FIG. 1, a storage unit 36 of FIG. 1, integrity processing unit 20 of FIG. 1, or managing unit 18 of FIG. 1.

The DSN functions to identify an encoded data slice for rebuilding, where data is dispersed storage error encoded to produce a plurality of sets of encoded data slices, where each set of encoded data slices includes an information dispersal algorithm (IDA) width number n of encoded data slices, where a plurality of sets of slice names is generated that are associated with the plurality of sets of encoded data slices, and where the plurality of sets of encoded data slices and the associated plurality of sets of slice names are stored in the DST execution units 1-n. In an example of operation of the identifying of the encoded data slice for rebuilding, a DST execution unit detects a physical storage failure associated with a memory portion of the DST execution unit. The detecting includes at least one of initiating a memory test, interpreting a memory test result, interpreting a received error message, and determining that a calculated storage integrity value of the memory portion compares unfavorably with a stored integrity value of the memory portion. For example, DST execution unit 1 indicates that memory portion 2 of the DST execution unit 1 is associated with the physical storage failure when detecting that the memory portion 2 is associated with a memory failure (e.g., a lost memory block, a failed memory device, etc.).

Having detected the physical storage failure, the DST execution unit identifies the memory portion to produce a memory portion identifier. The identifying includes producing the memory portion identifier to include one or more of a memory identifier, a black identifier, a track identifier, etc., based on the detecting of the physical storage failure.

Having identified the memory portion, the DST execution unit identifies one or more encoded data slices associated with the memory portion to produce one or more slice names. As a specific example, the DST execution unit 1 accesses a physical location to slice name table utilizing the memory portion identifier 2 to extract the one or more slice names. As another specific example, the DST execution unit 1 identifies one or more corrupted encoded data slices associated with the memory portion 2.

Having identified the one or more encoded data slices, the DST execution unit selects which encoded data slices of the identified one or more encoded data slices associated with the memory portion require rebuilding. The selecting includes performing an integrity check. For example, the DST execution unit 1 indicates selecting each of the one or more encoded data slices when the DST execution unit 1 determines that calculated integrity values for the one or more encoded data slices compares unfavorably to stored integrity values for the one or more encoded data slices. Having identified which encoded data slices require rebuilding, the DST execution unit issues, via the network 24, rebuilding information to the rebuilding module 652, where the rebuilding information includes the identified encoded data slices that require rebuilding. For example, the DST execution unit 1 issues, via the network 24, rebuilding information 1 to the rebuilding module 652, where the rebuilding information 1 includes slice names of the selected one or more encoded data slices. Rebuilding information can also be issued to, an integrity processing unit 20 of FIG. 1, another DST EX unit, such as storage unit 36 of Figure, and/or a DST processing unit, such as computing device 16 of FIG. 1.

FIG. 10 is a flowchart illustrating an example of identifying an encoded data slice for rebuilding. The method includes step 656 where a processing module of a storage unit (e.g., of a DST EX unit), which can be implemented using computer core 26 of FIG. 1, detects a physical storage failure associated with a memory portion of the storage unit. The detecting includes at least one of interpreting a memory test result, interpreting a received error message, and detecting corruption within the memory portion.

The method continues at step 658 where the processing module identifies the memory portion to produce a memory portion identifier. The identifying may be based on one or more of the detecting of the storage failure, performing a lookup, and interpreting the error message. The method continues at step 660 where the processing module identifies one or more encoded data slices associated with the memory portion to produce one or more slice names. For example, the processing module accesses a physical location to slice name table utilizing the memory portion identifier. As another example, the processing module identifies one or more corrupted encoded data slices associated with the memory portion.

The method continues at step 662 where the processing module selects encoded data slices of the identified one or more encoded data slices for rebuilding. For example, the processing module verifies corruption of the one or more encoded data slices to produce the selected encoded data slices (e.g., by facilitating performing of an integrity check function). In some embodiments, facilitating performance of an integrity check function can include transmitting a request for the integrity processing unit 20 of FIG. 1 to perform an integrity check. The method continues at step 664 where the processing module issues rebuilding information to a rebuilding module, where the rebuilding information includes identifiers of the selected encoded data slices for rebuilding. For example, the processing module generates the rebuilding information to include slice names of the selected encoded data slices and sends the rebuilding information to at least one of the rebuilding module, a DST integrity processing unit, and a DST execution unit, a DST processing unit. Alternatively, or in addition to, the processing module facilitates rebuilding of the selected encoded data slices and stores rebuilt encoded data slices in another memory portion of the storage unit.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a distributed storage network (DSN) including a plurality of distributed storage task execution (DST EX) units, each of the plurality of DST EX units employing a plurality of memory portions to store encoded data slices, the method comprising:
    detecting, by a DST EX unit, a physical storage failure associated with an affected memory portion of a storage unit included in the DST EX unit;
    determining, by the DST EX unit, a memory portion identifier of the affected memory portion;
    identifying, by the DST EX unit, at least a range of impacted encoded data slices associated with the affected memory portion; and
    issuing, by the DST EX unit, rebuilding information to the DSN, the rebuilding information includes at least one identifier associated with at least one impacted encoded data slice included in the at least a range of impacted encoded data slices.

2. The method of claim 1, further comprising:
    identifying slice names of specific impacted encoded data slices associated with the affected memory portion.

3. The method of claim 1, further comprising:
    facilitating performance of an integrity check, the integrity check verifying that at least one impacted encoded data slice included in the at least a range of impacted encoded data slices is actually corrupted.

4. The method of claim 1, wherein identifying at least a range of impacted encoded data slices includes:
    accessing a physical location to slice name table utilizing the memory portion identifier.

5. The method of claim 1, further comprising:
    generating the rebuilding information to include slice names of each impacted encoded data slices.

6. The method of claim 1, further comprising:
    rebuilding the at least one impacted encoded data slice to generate a rebuilt encoded data slice; and
    storing the rebuilt encoded data slice in another memory portion of the DST EX unit.

7. The method of claim 1, further comprising:
    issuing the rebuilding information to at least one of a rebuilding module, an integrity processing unit, another DST EX unit, or a DST processing unit.

8. A distributed storage task execution (DST EX) unit for use in a distributed storage network (DSN), the DST EX unit comprising:
    a processor and associated memory;
    one or more distributed storage (DS) memories coupled to the processor and associated memory, the one or more DS memories including a plurality of memory portions used by the processor and associated memory to store encoded data slices;
    the processor and associated memory configured to:
        detect a physical storage failure associated with an affected memory portion of the one or more DS memories;
        determine a memory portion identifier of the affected memory portion;
        identify at least a range of impacted encoded data slices associated with the affected memory portion; and
        issue rebuilding information to the DSN, the rebuilding information includes at least one identifier associated with at least one impacted encoded data slice included in the at least a range of impacted encoded data slices.

9. The distributed storage task execution (DST EX) unit of claim 8, the processor and associated memory further configured to:
identify slice names of specific impacted encoded data slices associated with the affected memory portion.

10. The distributed storage task execution (DST EX) unit of claim 8, the processor and associated memory further configured to:
facilitate performance of an integrity check, the integrity check verifying that at least one impacted encoded data slice included in the at least a range of impacted encoded data slices is actually corrupted.

11. The distributed storage task execution (DST EX) unit of claim 8, the processor and associated memory further configured to:
identify at least a range of impacted encoded data slices by accessing a physical location to slice name table utilizing the memory portion identifier.

12. The distributed storage task execution (DST EX) unit of claim 8, the processor and associated memory further configured to:
generate the rebuilding information to include slice names of each impacted encoded data slices.

13. The distributed storage task execution (DST EX) unit of claim 8, the processor and associated memory further configured to:
rebuild the at least one impacted encoded data slice to generate a rebuilt encoded data slice; and
store the rebuilt encoded data slice in another memory portion.

14. The distributed storage task execution (DST EX) unit of claim 8, the processor and associated memory further configured to:
issue the rebuilding information to at least one of a rebuilding module, an integrity processing unit, another DST EX unit, or a DST processing unit.

15. A distributed storage network (DSN) comprising:
a set of distributed storage task execution (DST EX) units, at least one DST EX unit included in the set of DST EX units including:
a processor and associated memory;
one or more distributed storage (DS) memories coupled to the processor and associated memory, the one or more DS memories including a plurality of memory portions used by the processor and associated memory to store encoded data slices;
the processor and associated memory configured to:
detect a physical storage failure associated with an affected memory portion of the one or more DS memories;
determine a memory portion identifier of the affected memory portion;
identify at least a range of impacted encoded data slices associated with the affected memory portion; and
issue rebuilding information to the DSN, the rebuilding information includes at least one identifier associated with at least one impacted encoded data slice included in the at least a range of impacted encoded data slices.

16. The distributed storage network (DSN) of claim 15, the processor and associated memory further configured to:
identify slice names of specific impacted encoded data slices associated with the affected memory portion.

17. The distributed storage network (DSN) of claim 15, the DSN further including:
an integrity processing unit coupled to the at least one DST EX unit; and
the DST EX unit configured to verify that at least one impacted encoded data slice included in the at least a range of impacted encoded data slices is actually corrupted by requesting the integrity processing unit to perform an integrity check.

18. The distributed storage network (DSN) of claim 15, the processor and associated memory further configured to:
identify at least a range of impacted encoded data slices by accessing a physical location to slice name table utilizing the memory portion identifier.

19. The distributed storage network (DSN) of claim 15, the processor and associated memory further configured to:
generate the rebuilding information to include slice names of each impacted encoded data slices.

20. The distributed storage network (DSN) of claim 15, DSN further including:
a rebuilding module coupled to the at least one DST EX unit, the rebuilding module configured to rebuild encoded data slices on behalf of the at least one DST EX unit;
the at least one DST EX unit configured to:
issue the rebuilding information to the rebuilding module;
receive a rebuilt encoded data slice from the rebuilding module; and
store the rebuilt encoded data slice in another memory portion.

\* \* \* \* \*